United States Patent
Dwivedi et al.

(10) Patent No.: US 9,177,636 B1
(45) Date of Patent: Nov. 3, 2015

(54) 8T BASED SRAM CELL AND RELATED METHOD

(71) Applicant: International Business Machines Corporation, Armonk, NY (US)

(72) Inventors: Devesh Dwivedi, Bangalore (IN); Chandrabhan Kushwah, Gwalior (IN); Sathisha Nanjundegowda, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/274,011

(22) Filed: May 9, 2014

(51) Int. Cl.
*G11C 11/41* (2006.01)
*G11C 11/419* (2006.01)
*G11C 11/412* (2006.01)
*G11C 11/413* (2006.01)

(52) U.S. Cl.
CPC ............. *G11C 11/419* (2013.01); *G11C 11/41* (2013.01); *G11C 11/412* (2013.01); *G11C 11/413* (2013.01)

(58) Field of Classification Search
CPC .... G11C 11/41; G11C 11/412; G11C 11/413; G11C 11/419
See application file for complete search history.

(56) References Cited

U.S. PATENT DOCUMENTS

| | | | | |
|---|---|---|---|---|
| 4,375,677 A | * | 3/1983 | Schuermeyer | 365/154 |
| 6,744,661 B1 | * | 6/2004 | Shubat | 365/156 |
| 6,975,532 B1 | * | 12/2005 | Kosonocky et al. | 365/154 |
| 7,286,390 B2 | * | 10/2007 | Yokoyama | 365/154 |
| 7,511,988 B2 | * | 3/2009 | Lin et al. | 365/154 |
| 7,672,152 B1 | * | 3/2010 | Kulkarni et al. | 365/154 |
| 7,684,263 B2 | | 3/2010 | Adams et al. | |
| 7,808,812 B2 | | 10/2010 | Liu et al. | |

(Continued)

FOREIGN PATENT DOCUMENTS

| | | |
|---|---|---|
| CN | 103077741 A | 5/2013 |
| WO | 2009078220 A1 | 6/2009 |

OTHER PUBLICATIONS

Chang et al., A Differential Data Aware Power-supplied 8T SRAM Cell with Expanded Write/Read Stabilities for Lower VDDmin Applications, 2009 Symposium on VLSI Circuits Digest of Technical Papers.

*Primary Examiner* — J. H. Hur

(74) *Attorney, Agent, or Firm* — David A. Cain; Hoffman Warnick LLC

(57) ABSTRACT

Various embodiments include memory devices and related methods. An embodiment includes circuitry including: a first inverter having a first inverter storage node, the first inverter cross-coupled to a second inverter having a second inverter storage node, wherein each of the first inverter and the second inverter has a reverse bit line controlled feedback transistor coupled between an pull-down transistor and a pull-up transistor, and wherein each pull-down transistor is further coupled to a ground; a first signal line coupled with the reverse bit line controlled feedback transistor of the second inverter; a second signal line coupled with the reverse bit line controlled feedback transistor of the first inverter; a first access transistor coupled with the first inverter storage node, the first signal line, and a third signal line; and a second access transistor coupled with the second inverter storage node, the second signal line, and the third signal line.

20 Claims, 6 Drawing Sheets

(56) References Cited

U.S. PATENT DOCUMENTS

| | | |
|---|---|---|
| 7,808,812 B2 | 10/2010 | Liu et al. |
| 8,243,530 B2 | 8/2012 | Kang et al. |
| 2010/0195374 A1* | 8/2010 | Rennie et al. ............... 365/156 |
| 2011/0007580 A1 | 1/2011 | Houston et al. |
| 2012/0014171 A1* | 1/2012 | Chuang et al. ............... 365/154 |
| 2012/0120717 A1 | 5/2012 | Sekigawa et al. |
| 2013/0088931 A1 | 4/2013 | Braceras et al. |
| 2013/0114332 A1* | 5/2013 | Laplanche et al. ............ 365/154 |

* cited by examiner

8T BASED SRAM CELL AND RELATED METHOD

BACKGROUND

Aspects of the invention relate generally to the field of data processing. More particularly, various aspects of the invention relate to static random-access memory (SRAM) circuitry and read and write functions thereon.

Semiconductor memory devices retain data bits in memory and are useful in the fields of industrial and scientific subsystems. Compared with dynamic RAM devices (DRAM), containing at least a capacitor and a transistor, conventional SRAM device structure includes a six-transistor (6-T) cell having six metal-oxide-semiconductors-field-effect-transistors (MOSFETs). Wherein DRAM devices must be periodically refreshed, SRAM devices exhibit data remanence, where data is retained as long as power is being supplied.

Conventional 6-T SRAM devices store bits on four transistors that form two cross-coupled inverters. Storage cells have two stable states, denoted by a 0 and 1. Two access transistors coupled with each of the inverters serve to control access to a storage cell during read and write functions. Typically, a word line enables access to the cell. The word line controls the two access transistors, which in turn, control the connection to a bit line. Furthermore, SRAM cells have three different states: hold (the circuit is idle), read (data has been requested), and write (updating the contents of the cell).

While conventional SRAM devices provide benefits over DRAM devices, namely static memory and improved speed, conventional SRAM devices still face many challenges. The traditional 6-T SRAM cell faces limitations in read disturb, write margins, leakage, process variation, area, and half selection. For instance, a potential difference between the bit line and a storage cell during read functions can increase the threshold voltage ($V_{th}$) of the storage cell and flip the value in the storage cell. In another example, read functions on 6-T SRAM cells can cause nearby cells in the same memory block to change over time (known as a read disturb). If reading continually from the same cell, that cell will not fail, but other surrounding cells on subsequent reads will fail.

BRIEF SUMMARY

Solutions for read disturb, write margins, leakage, process variations, area, and half select of 6-T SRAM devices are disclosed herein. Various embodiments include an electronic circuit including a first and a second inverter, wherein each of the first inverter and the second inverter has a reverse bit line controlled feedback N-MOSFET (NMOS) transistor coupled between an NMOS pull-down transistor and a P-MOSFET (PMOS) pull-up transistor. Various additional embodiments include a method for reading and a method for writing an eight-transistor static random-access memory (SRAM). In some cases, an embodiment includes: an electronic circuit including: a first inverter having a first inverter storage node, the first inverter cross-coupled to a second inverter having a second inverter storage node, wherein each of the first inverter and the second inverter has a reverse bit line controlled feedback NMOS transistor coupled between an NMOS pull-down transistor and a PMOS pull-up transistor, and wherein each NMOS pull-down transistor is further coupled to a ground; a first signal line coupled with the reverse bit line controlled feedback NMOS transistor of the second inverter; a second signal line coupled with the reverse bit line controlled feedback NMOS transistor of the first inverter; a first access transistor coupled with the first inverter storage node, the first signal line, and a third signal line; and a second access transistor coupled with the second inverter storage node, the second signal line, and the third signal line.

A first aspect includes an electronic circuit including: a first inverter having a first inverter storage node, the first inverter cross-coupled to a second inverter having a second inverter storage node, wherein each of the first inverter and the second inverter has a reverse bit line controlled feedback NMOS transistor coupled between an NMOS pull-down transistor and a PMOS pull-up transistor, and wherein each NMOS pull-down transistor is further coupled to a ground; a first signal line coupled with the reverse bit line controlled feedback NMOS transistor of the second inverter; a second signal line coupled with the reverse bit line controlled feedback NMOS transistor of the first inverter; a first access transistor coupled with the first inverter storage node, the first signal line, and a third signal line; and a second access transistor coupled with the second inverter storage node, the second signal line, and the third signal line.

A second aspect includes a method including: performing a read function with the eight transistor SRAM device including: coupling an eight transistor static random-access memory (SRAM) device having a first and a second inverter, wherein the first and the second inverter include a reverse bit line controlled feedback N-MOSFET (NMOS) transistor coupled with a P-MOSFET (PMOS) pull-up transistor and an NMOS pull-down transistor, with a first signal line to form a communication path, wherein the first signal line is in communication with the reverse bit line controlled feedback NMOS transistor of the second inverter and a first access transistor; coupling the eight transistor SRAM device with a second signal line to form a communication path, wherein the second signal line is in communication with the reverse bit line controlled feedback NMOS transistor of the first inverter and a second access transistor; and coupling each of the first access transistor and the second access transistor with a third signal line to form a communication path; and isolating a node in the SRAM device using the reverse bit line controlled feedback NMOS transistor in the first and the second inverter.

A third aspect includes a method including: performing a write function with the eight transistor SRAM device including: coupling an eight transistor static random-access memory (SRAM) device having a first and a second inverter, wherein the first and the second inverter include a reverse bit line controlled feedback N-MOSFET (NMOS) transistor coupled with a P-MOSFET (PMOS) pull-up transistor and an NMOS pull-down transistor, with a first signal line to form a communication path, wherein the first signal line is in communication with the reverse bit line controlled feedback NMOS transistor of the second inverter and a first access transistor; coupling the eight transistor SRAM device with a second signal line to form a communication path, wherein the second signal line is in communication with the reverse bit line controlled feedback NMOS transistor of the first inverter and a second access transistor; coupling each of the first access transistor and the second access transistor with a third signal line to form a communication path; and controlling feedback between the first and the second inverter by activating the reverse bit line controlled feedback transistors of the first and the second inverter, in response to performing the write function.

BRIEF DESCRIPTION OF THE DRAWINGS

It is noted that the drawings are not necessarily to scale. The drawings are intended to depict only typical aspects, and therefore should not be considered as limiting in scope. In the drawings, like numbering represents like elements between the drawings.

DETAILED DESCRIPTION

In the following description, reference is made to the accompanying drawings that form a part thereof, and in which is shown by way of illustration specific example embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Various particular embodiments include an electronic circuit including a first and a second inverter, wherein each of the first inverter and the second inverter has a reverse bit line controlled feedback NMOS transistor coupled between an NMOS pull-down transistor and a PMOS pull-up transistor. Various additional embodiments include a method for reading and a method for writing an eight-transistor static random-access memory (SRAM) device.

In order to describe aspects of the various embodiments conveniently, the following technical terms are defined: $V_g$: gate-voltage; $V_d$: drain-voltage; $I_d$: drain current; and $V_{th}$: threshold voltage. In addition, it is understood that all references herein to drain-voltage, gate-voltage, and source-voltage, are taken at a drain contact, a gate contact, and a source contact of a metal-oxide-semiconductor-field-effect-transistor (MOSFET) respectively.

Figure 1:
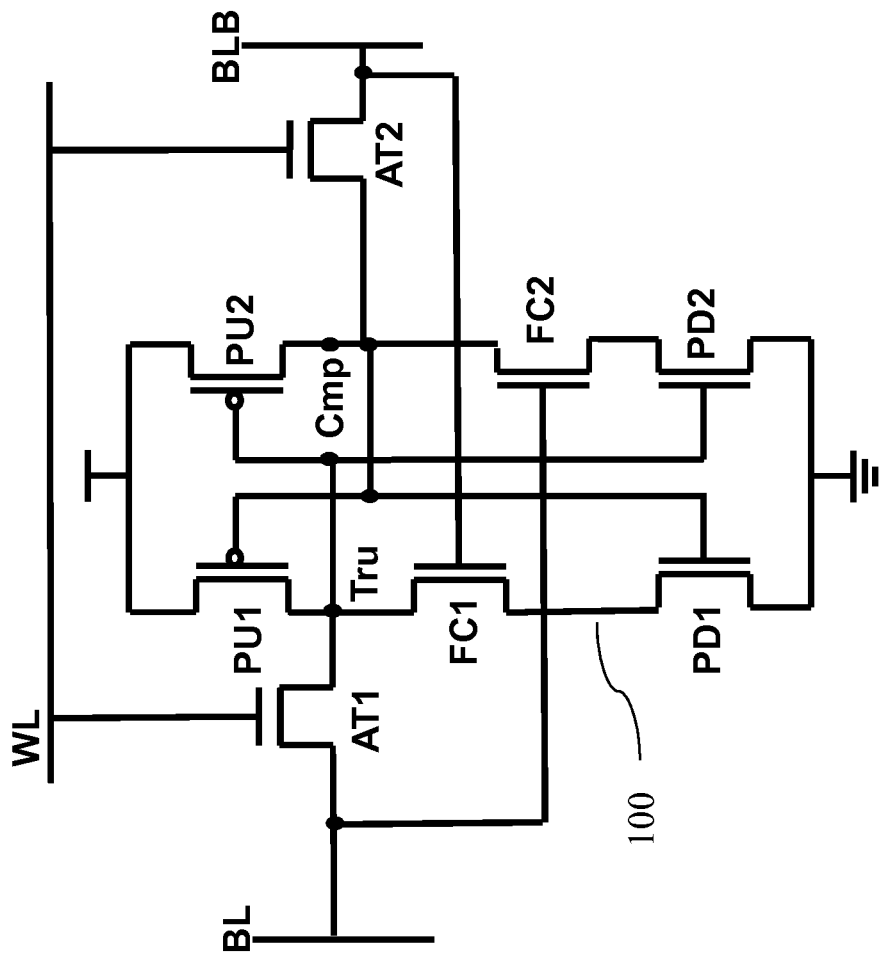
FIG. 1 shows a schematic depiction of an 8T based SRAM cell according to various embodiments.

Turning to FIG. 1, a top view of an eight-transistor (8-T) SRAM device 100 according to various embodiments is shown. According to various embodiments, each transistor in SRAM device 100 may be a MOSFET. Each MOSFET may include a four-terminal device having a source, a gate, a drain, and a body. It is understood that the body of the MOSFET can be tied to a source creating an internal short circuit, and resulting in an effective three terminal device. The resulting three terminals will be referred to as the gate, the drain, and the source.

Figure 2:
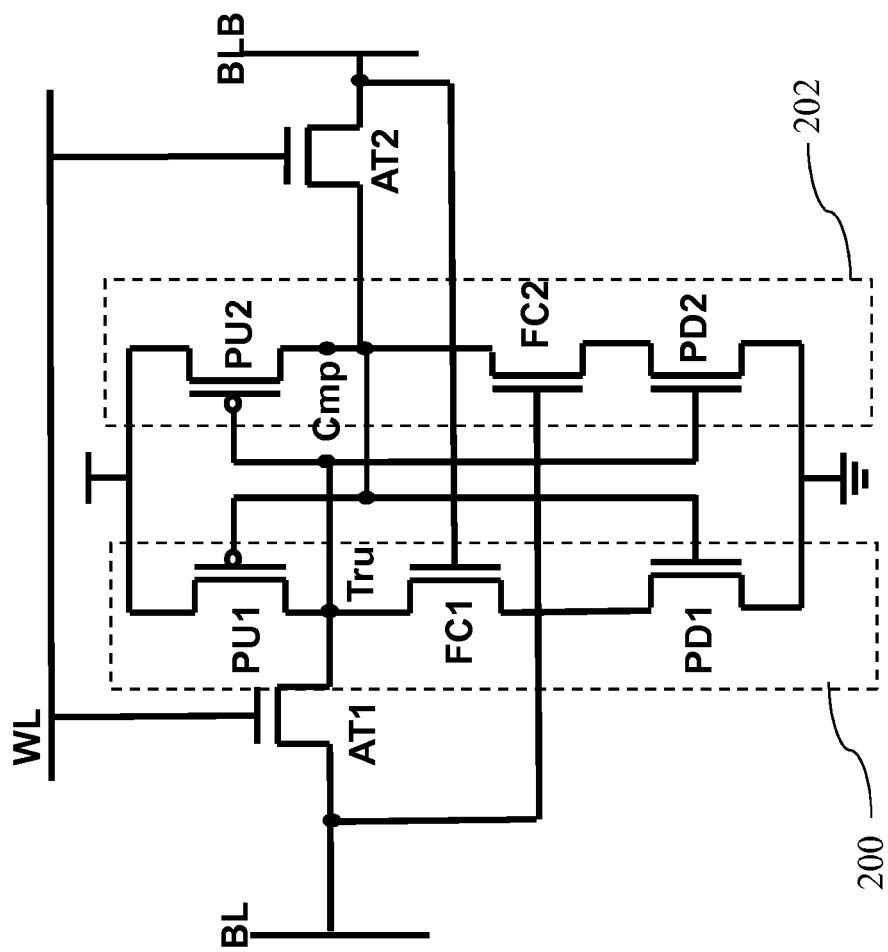
FIG. 2 shows the schematic depiction of FIG. 1 further including a first and a second inverter.

Turning now to FIG. 2, with continuing reference to FIG. 1, SRAM device 100 can include a first inverter 200 having a first storage node (Tru) cross-coupled with a second inverter 202 having a second storage node (Cmp). According to various embodiments, first inverter 200 includes a reverse bit line controlled feedback NMOS transistor FC1. Reverse bit line controlled feedback NMOS transistor FC1 is coupled with a N-MOSFET (NMOS) pull-down transistor PD1 and a P-MOSFET (PMOS) pull-up transistor PU1. As is understood, pull-up transistor PU1 and pull-down transistor PD1 are configured to act as current sources that regulate the pull up or pull down of the current to a nearly constant current. Similarly, second inverter 202 includes a reverse bit line controlled feedback NMOS transistor FC2. Reverse bit line controlled feedback NMOS transistor FC2 is coupled with a NMOS pull-down transistor PD2 and a PMOS pull-up transistor PU2. As is shown in FIGS. 1 and 2, each NMOS pull-down transistor (e.g., pull-down transistors PD1 and PD2) can be further coupled with a ground.

According to various embodiments, SRAM device 100 can include a first access transistor AT1 coupled with the storage node (Tru) of inverter 200. Similarly, SRAM device 100 can include a second access transistor AT2 coupled with the storage node (Cmp) of inverter 202. As shown in FIG. 2, access transistor AT1 can be further coupled with a first signal line BL. According to further embodiments, access transistor AT2 can be further coupled with a second signal line BLB. First signal line BL can be a first bit line, and second signal line BLB can be a second bit line. As is understood, first and second signal lines BL and BLB are used to transfer data during read and write functions. According to an embodiment, first and second signal lines BL and BLB form a bit line pair, wherein the inverse of a signal provided on signal line BL is provided on signal line BLB.

In various embodiments, first and second signal lines BL and BLB control reverse bit line controlled NMOS feedback transistors FC1 and FC2. As shown in FIGS. 1 and 2, first signal line BL can be coupled with the gate of reverse bit line controlled NMOS feedback transistor FC2 and second signal line BLB can be coupled with the gate of reverse bit line controlled NMOS feedback transistor FC1. The cross-coupling as described herein, creates a "reverse bit line controlled" formation. That is, the first signal line BL, is controlling reverse bit line controlled NMOS feedback transistor FC2 of second inverter 202, and the second signal line BLB is controlling reverse bit line controlled NMOS feedback transistor FC1 of first inverter 200.

In further embodiments, a third signal line WL is coupled with the gate of each first access transistor AT1 and second access transistor AT2. According to further embodiments, third signal line WL includes a word line. As is understood, third signal line WL controls access transistors AT1 and AT2, which control access of first inverter 200 and second inverter 202 to each first signal line BL and second signal line BLB.

Figure 3:
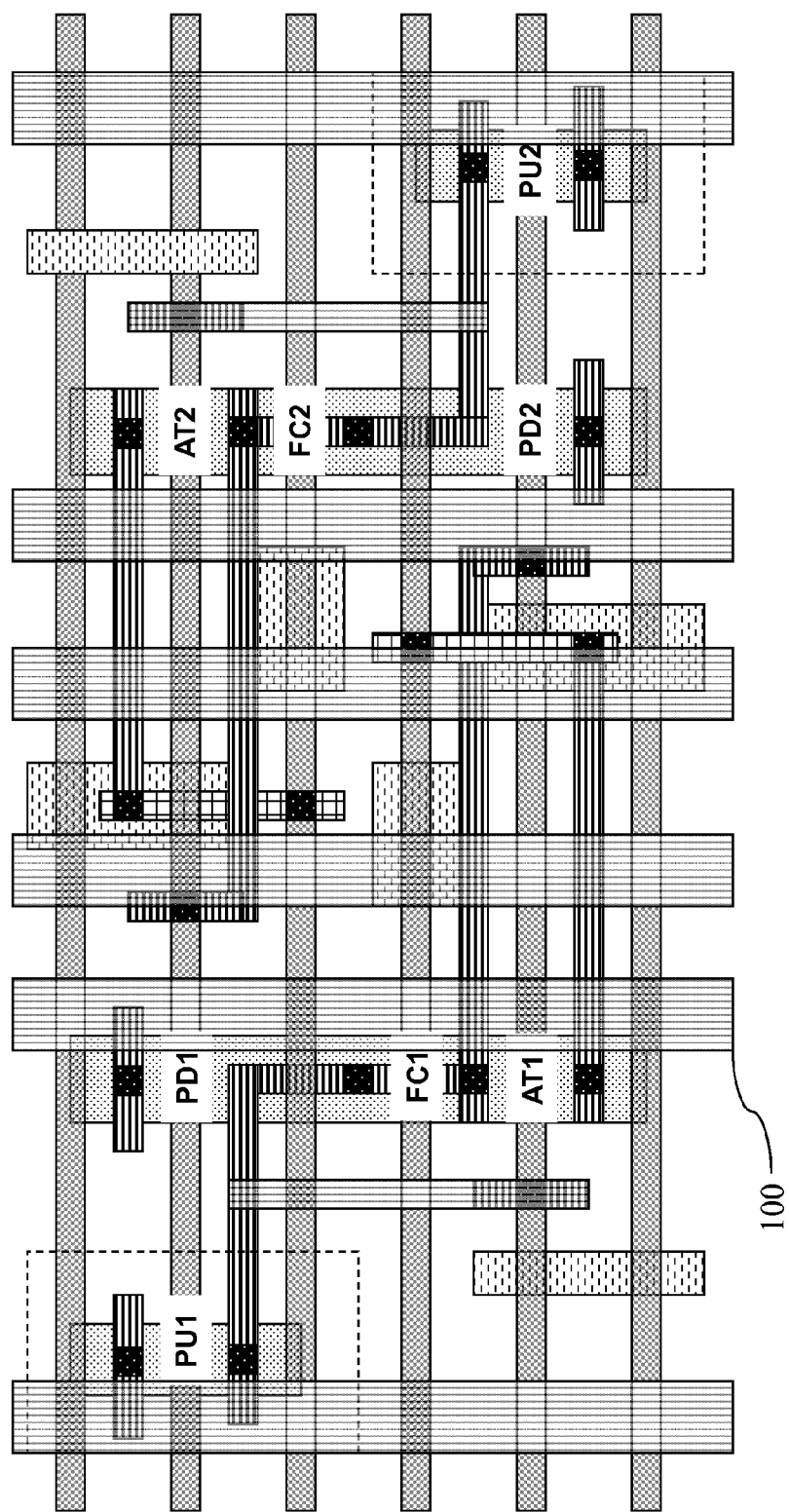
FIG. 3 shows a topographical layout of an 8T based SRAM cell according to various embodiments.

Turning now to FIG. 3, with continuing reference to FIGS. 1 and 2, a topographical layout of an 8T based SRAM cell according to various embodiments is shown. In an additional embodiment, SRAM device 100 has a length of approximately 1.375 μm and a width of approximately 0.4 μm, resulting in an area of 0.55 μm².

Figure 4:
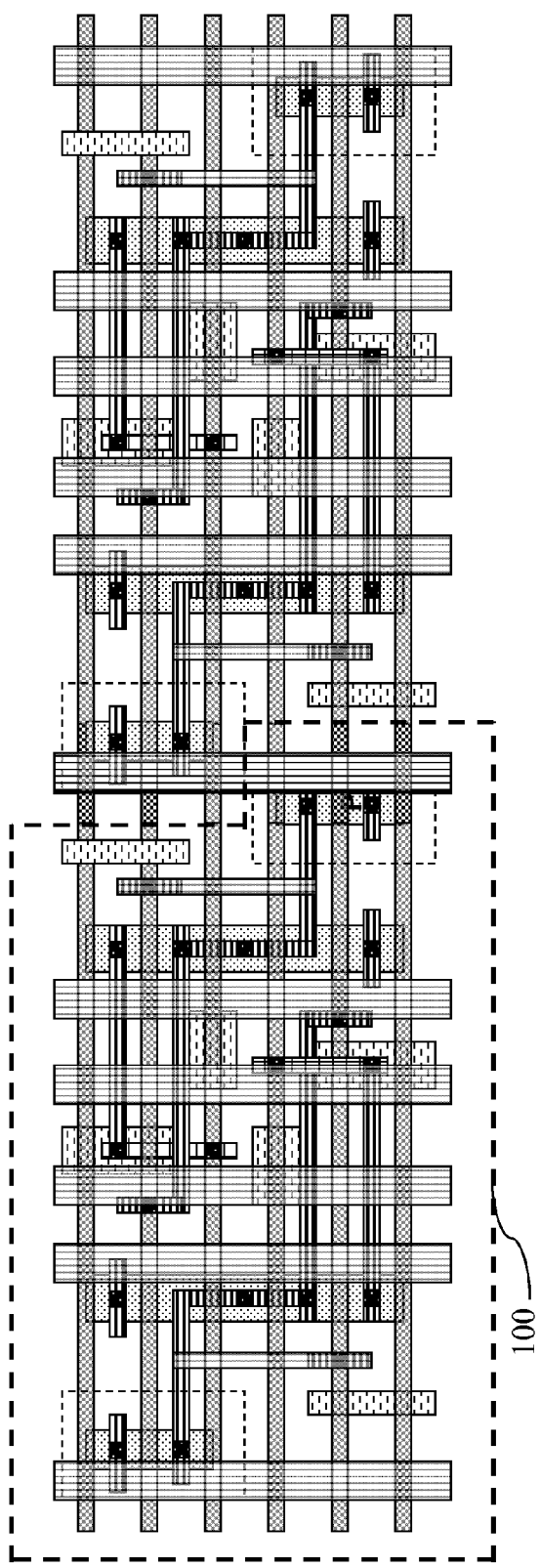
FIG. 4 shows the topographical layout of FIG. 3 further including a second 8T based SRAM cell.

Turning to FIG. 4, with continuing reference to FIGS. 1, 2, and 3, further embodiments can include a plurality of stacked SRAM devices (e.g., SRAM device 100). For example, as FIG. 4 shows, a second 8T based SRAM device can be coupled to a first 8T based SRAM device (e.g, SRAM device 100). In an embodiment, the stacked first and second SRAM device can have a length of approximately 2.45 μm and a width of approximately 0.4 μm, resulting in an area of 0.98 μm².

Figure 5:
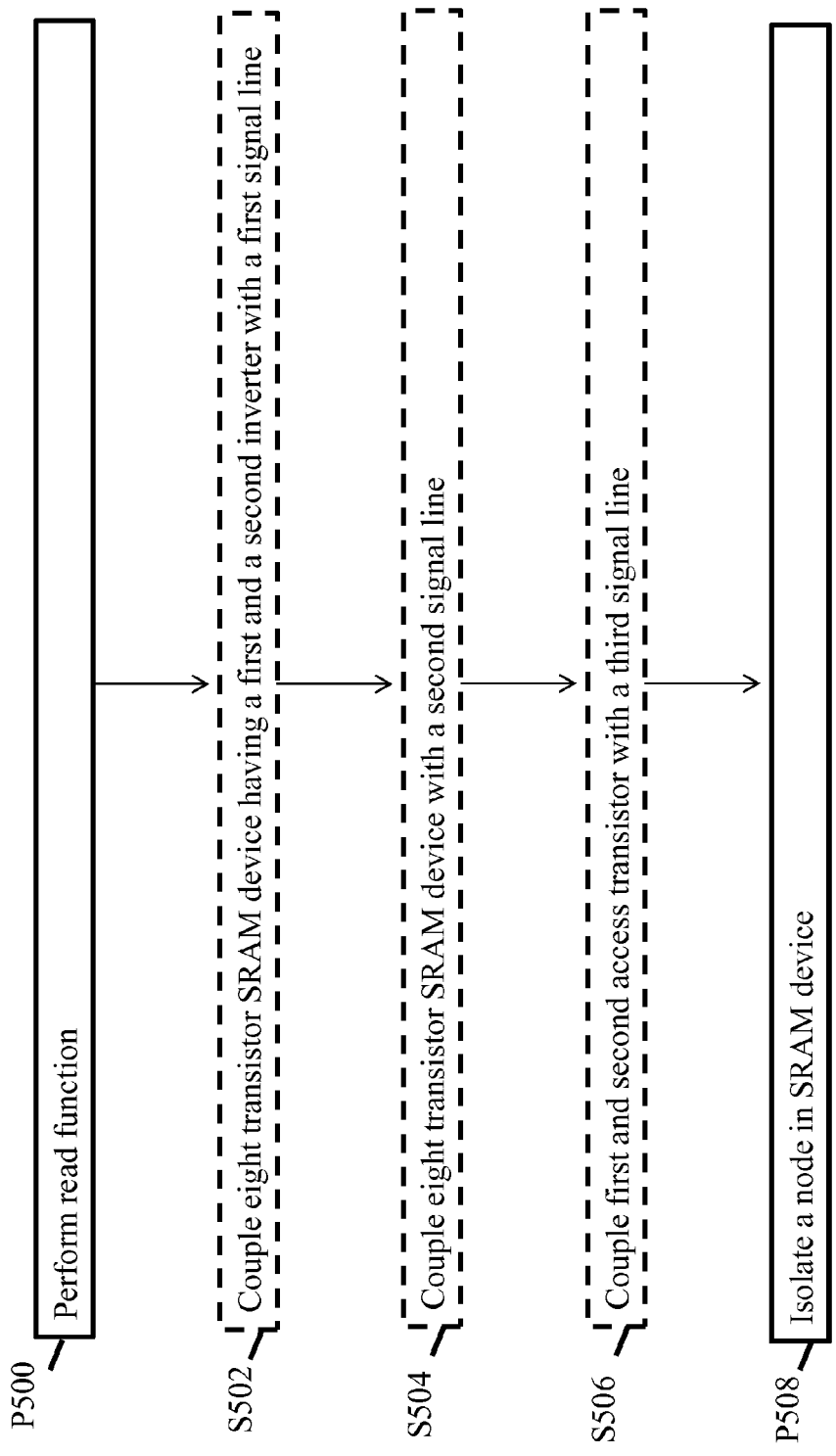
FIGS. 5 and 6 show flow diagrams depicting a process according to various embodiments.

Turning now to FIG. 5, with continuing reference to FIGS. 1 and 2, the flow diagram depicting the method according to various embodiments can include the following processes:

P500: Performing a read function with the eight transistor SRAM device. In various embodiments, the read function requests data from SRAM device 100 and can include:

S502: Coupling an eight transistor static random-access memory (SRAM) device having a first and a second inverter, wherein the first and the second inverter include a reverse bit line controlled feedback NMOS transistor coupled with a PMOS pull-up transistor and an NMOS pull-down transistor, with a first signal line to form a communication path, wherein the first signal line is in communication with the reverse bit line controlled feedback NMOS transistor of the second inverter and a first access transistor. In various embodiments, first signal line BL includes a bit line and transfers data during read and write functions. Furthermore, first access transistor AT1, also coupled with first signal line BL, controls access to signal line BL prior to read and write functions.

S504: After coupling an eight transistor static random-access memory (SRAM) device having a first and a second inverter, wherein the first and the second inverter include a reverse bit line controlled feedback NMOS transistor coupled with a PMOS pull-up transistor and an NMOS pull-down transistor, with a first signal line to form a communication path, wherein the first signal line is in communication with the reverse bit line controlled feedback NMOS transistor of the second inverter and a first access transistor, the method can include coupling the eight transistor SRAM device with a second signal line to form a communication path, wherein the second signal line is in communication with the reverse bit line controlled feedback NMOS transistor of the first inverter and a second access transistor. In various embodiments, second signal line BLB includes a second bit line and transfers data during read and write functions. Furthermore, second access transistor AT2, also coupled with second signal line BLB, controls access to second signal line BLB prior to read and write functions.

S506: After coupling the eight transistor SRAM device with a second signal line to form a communication path, wherein the second signal line is in communication with the reverse bit line controlled feedback NMOS transistor of the first inverter and a second access transistor, the method can include coupling each of the first access transistor and the second access transistor with a third signal line to form a communication path. As used herein, third signal line WL can include a word line. According to various embodiments, the method further includes controlling first and second access transistors AT1 and AT2 with the third signal line WL. As shown in FIGS. 1 and 2, third signal line WL is coupled with the gates of access transistors AT1 and AT2 respectively.

During the read function, first signal line BL and second signal line BLB are driven high and low by first inverter 200 and second inverter 202. In various embodiments, the read function includes: pre-charging first signal line BL and second signal line BLB at a predetermined voltage level, and activating third signal line WL. Depending on the state of first inverter 200 storage node (Tru) or second inverter 202 storage node (Cmp), either first signal line BL or second signal line BLB will discharge. Discharging signal line BL or BLB forces respective reverse bit line controlled NMOS feedback transistor FC1 or FC2 to enter a cut-off region, which enhances the isolation of respective storage node (Cmp or Tru). A differential voltage developed between first signal line BL and second signal line BLB can be amplified and read as output data of SRAM device 100. Further embodiments include activating the reverse bit line controlled feedback NMOS transistor in the first inverter and the second inverter (e.g. FC1 and FC2) in response to performing the read function. Reverse bit line controlled feedback NMOS transistor FC1 is activated with second signal line BLB, and reverse bit line controlled feedback NMOS transistor FC2 is activated with first signal line BL.

P508: After performing a read function with the eight-transistor SRAM device, the method can include isolating a node in the SRAM device using the reverse bit line controlled feedback NMOS transistor in the first and the second inverter. Reverse bit line controlled feedback NMOS transistors FC1 and FC2 create a high impedance and isolate the ground from first inverter 200 storage node (Tru) and second inverter 202 storage node (Cmp). This enhances read static noise margin, and otherwise prevents an increase in $V_{th}$ that would flip a bit cell value during the read function.

Figure 6:
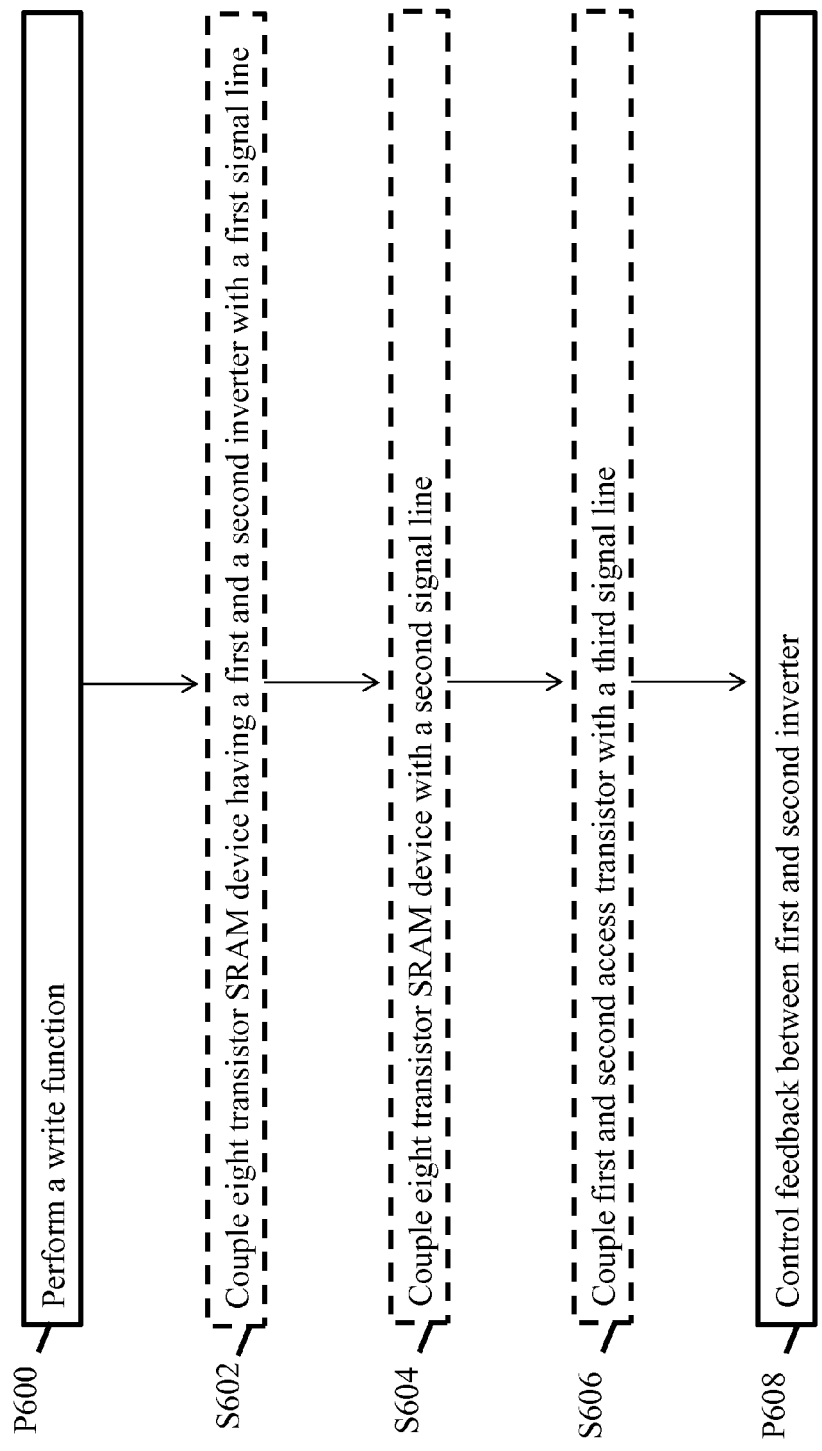

Turning now to FIG. 6, with continuing reference to FIGS. 1 and 2, the flow diagram depicting a method according to various embodiments can include the following processes:

P600: Performing a write function with the eight transistor SRAM device. In various embodiments, the write function updates the contents SRAM device 100 and can include:

S602: Coupling an eight transistor static random-access memory (SRAM) device having a first and a second inverter, wherein the first and the second inverter include a reverse bit line controlled feedback NMOS transistor coupled with a PMOS pull-up transistor and an NMOS pull-down transistor, with a first signal line to form a communication path, wherein the first signal line is in communication with the reverse bit line controlled feedback NMOS transistor of the second inverter and a first access transistor. As described herein, various embodiments include activating reverse bit line controlled feedback NMOS transistor FC2 of the second inverter with first signal line BL. In further embodiments, first signal line BL includes a bit line and transfers data during read and write functions. Furthermore, first access transistor AT1, also coupled with first signal line BL, controls access to first signal line BL prior to read and write functions S604: After coupling an eight transistor static random-access memory (SRAM) device having a first and a second inverter, wherein the first and the second inverter include a reverse bit line controlled feedback NMOS transistor coupled with a PMOS pull-up transistor and an NMOS pull-down transistor, with a first signal line to form a communication path, wherein the first signal line is in communication with the reverse bit line controlled feedback NMOS transistor of the second inverter and a first access transistor, the method can include coupling the eight transistor SRAM device with a second signal line to form a communication path, wherein the second signal line is in communication with the reverse bit line controlled feedback NMOS transistor of the first inverter and a second access transistor. In various embodiments, second signal line BLB, includes a bit line and transfers data during read and write functions. Furthermore, second access transistor AT2, also coupled with second signal line BLB, controls access to signal line BLB prior to read and write functions.

S606: After coupling the eight transistor SRAM device with a second signal line to form a communication path, wherein the second signal line is in communication with the reverse bit line controlled feedback NMOS transistor of the first inverter and a second access transistor, the method can include coupling each of the first access transistor and the second access transistor with a third signal line to form a communication path. As used herein, third signal line WL can include a word line. According to various embodiments, the method further includes controlling first and second access transistors AT1 and AT2 with the third signal line WL. As shown in FIGS. 1 and 2, third signal line WL is coupled with the gates of access transistors AT1 and AT2 respectively.

In various embodiments, the write function includes: driving first signal line BL or second signal line BLB from a pre-charged value to the ground potential by a write driver through respective access transistor AT1 or AT2, and activating third signal line WL. The discharging signal line (e.g., first signal line BL or second signal line BLB) forces respective reverse bit line controlled feedback NMOS transistor FC1 or FC2 to enter a cut-off region and cut the feedback between first inverter 200 and second inverter 202. As such, the absence of a current driving path from first inverter 200 storage node (Tru) or second inverter 202 storage node (Cmp) to the ground enables the signal line (e.g., first signal line BL or second signal line BLB) to provide an unhindered voltage hike at the storage node (Tru or Cmp), thus accomplishing the write function. Further embodiments include activating the reverse bit line controlled feedback NMOS transistor in the first inverter and the second inverter (e.g. FC1 and FC2) in response to performing the write function. Reverse bit line controlled feedback NMOS transistor FC1 is activated with second signal line BLB, and reverse bit line controlled feedback NMOS transistor FC2 is activated with first signal line BL.

P608: After performing a write function with the eight transistor SRAM device, the method can include controlling feedback between the first and the second inverter by activating the reverse bit line controlled feedback transistors of the first and the second inverter, in response to performing the write function. In various embodiments, if the reverse bit line controlled NMOS feedback transistors FC1 and FC2 are active, the positive feedback between first inverter 200 and second inverter 202 helps in hold the data. However, if the reverse bit line controlled NMOS feedback transistor FC1 or FC2 is in the cut-off region, it removes a current driving path from first inverter 200 storage node (Tru) or second inverter 202 storage node (Cmp) to the ground and cuts the feedback between first inverter 200 and second inverter 202.

As described herein, reverse bit line controlled feedback NMOS transistor FC1 is controlled with second signal line BLB, and reverse bit line controlled feedback NMOS transistor FC2 is controlled with first signal line BL. While data is being retained in SRAM device 100, first signal line BL and second signal line BLB keep reverse bit line controlled feedback NMOS transistors FC1 and FC2 active. Reverse bit line controlled feedback NMOS transistors FC1 and FC2 assist positive feedback between first inverter 200 and second inverter 202. Discharging first signal line BL or second signal line BLB while reading weakens reverse bit line controlled feedback NMOS transistor FC1 or FC2 and cuts the feedback between first inverter 200 and second inverter 202. This process minimizes read disturb.

In some cases, one or more of processes P500-P508, S502-S506, P600-P608, and S602-S606 can be repeated. For example, P500 (performing a read function with the eight transistor SRAM device) and P600 (performing a write function with the eight transistor SRAM device) can be repeated for a single SRAM device (e.g., SRAM device 100).

It is understood that in the flow diagram shown and described herein, other processes may be performed while not being shown, and the order of processes can be rearranged according to various embodiments. Additionally, intermediate processes may be performed between one or more described processes. The flow of processes shown and described herein is not to be construed as limiting of the various embodiments.

In various embodiments, components described as being "coupled" to one another can be joined along one or more interfaces. In some embodiments, these interfaces can include junctions between distinct components, and in other cases, these interfaces can include a solidly and/or integrally formed interconnection. That is, in some cases, components that are "coupled" to one another can be simultaneously formed to define a single continuous member. However, in other embodiments, these coupled components can be formed as separate members and be subsequently joined through known processes (e.g., fastening, ultrasonic welding, bonding).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof This written description uses examples to disclose various embodiments, including the best mode, and also to enable any person skilled in the art to practice, including making and using any devices or systems and performing any incorporated methods. The patentable scope of the various embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. An electronic circuit comprising:
   a first inverter having a first inverter storage node, the first inverter cross-coupled to a second inverter having a second inverter storage node, wherein each of the first inverter and the second inverter has a reverse bit line controlled feedback N-MOSFET (NMOS) transistor coupled between an NMOS pull-down transistor and a P-MOSFET (PMOS) pull-up transistor, and wherein each NMOS pull-down transistor is further coupled to a ground;
   a first signal line coupled with the reverse bit line controlled feedback NMOS transistor of the second inverter;
   a second signal line coupled with the reverse bit line controlled feedback NMOS transistor of the first inverter;
   a first access transistor coupled with the first inverter storage node, the first signal line, and a third signal line; and
   a second access transistor coupled with the second inverter storage node, the second signal line, and the third signal line.

2. The electronic circuit as recited in claim 1, wherein the reverse bit line controlled feedback NMOS transistor of the first inverter includes a gate coupled with the second signal line.

3. The electronic circuit as recited in claim 1, wherein the reverse bit line controlled feedback NMOS transistor of the second includes a gate coupled with the first signal line.

4. The electronic circuit as recited in claim 1, wherein the first access transistor includes a gate coupled with the third signal line.

5. The electronic circuit as recited in claim 1, wherein the second access includes a gate coupled with the third signal line.

6. The electronic circuit as recited in claim 1, wherein the first signal line includes a first bit line.

7. The electronic circuit as recited in claim 6, wherein the second signal line includes a second bit line.

8. The electronic circuit as recited in claim 7, wherein the first bit line and the second bit line form a bit line pair.

9. The electronic circuit as recited in claim 1, wherein the third signal line includes a word line.

10. A method comprising:
performing a read function with the eight transistor SRAM device comprising:
coupling an eight transistor static random-access memory (SRAM) device having a first inverter and a second inverter, wherein the first inverter and the second inverter include a reverse bit line controlled feedback N-MOSFET (NMOS) transistor coupled with a P-MOSFET (PMOS) pull-up transistor and an NMOS pull-down transistor, with a first signal line to form a communication path, wherein the first signal line is in communication with the reverse bit line controlled feedback NMOS transistor of the second inverter and a first access transistor;
coupling the eight transistor SRAM device with a second signal line to form a communication path, wherein the second signal line is in communication with the reverse bit line controlled feedback NMOS transistor of the first inverter and a second access transistor; and
coupling each of the first access transistor and the second access transistor with a third signal line to form a communication path; and
isolating a node in the SRAM device using the reverse bit line controlled feedback NMOS transistor in the first inverter and the second inverter.

11. The method as recited in claim 10, further comprising controlling the first access transistor and the second access transistor with the third signal line.

12. The method as recited in claim 10, wherein the first signal line includes a first bit line, the second signal line includes a second bit line, and the third signal line includes a word line.

13. The method as recited in claim 12, further comprising activating the reverse bit line controlled feedback transistors in the first and the second inverter in response to performing the read function.

14. The method as recited in claim 13, further comprising activating the reverse bit line controlled feedback NMOS transistor in the first inverter with the second bit line.

15. The method as recited in claim 13, further comprising activating the reverse bit line controlled feedback NMOS transistor in the second inverter with the first bit line.

16. A method comprising:
performing a write function with the eight transistor SRAM device comprising:
coupling an eight transistor static random-access memory (SRAM) device having a first inverter and a second inverter, wherein the first inverter and the second inverter include a reverse bit line controlled feedback N-MOSFET (NMOS) transistor coupled with a P-MOSFET (PMOS) pull-up transistor and an NMOS pull-down transistor, with a first signal line to form a communication path, wherein the first signal line is in communication with the reverse bit line controlled feedback NMOS transistor of the second inverter and a first access transistor;
coupling the eight transistor SRAM device with a second signal line to form a communication path, wherein the second signal line is in communication with the reverse bit line controlled feedback NMOS transistor of the first inverter and a second access transistor; and
coupling each of the first access transistor and the second access transistor with a third signal line to form a communication path; and
controlling feedback between the first inverter and the second inverter by activating the reverse bit line controlled feedback transistors of the first inverter and the second inverter, in response to performing the write function.

17. The method as recited in claim 16, wherein the first signal line includes a first bit line, the second signal line includes a second bit line, and the third signal line includes a word line.

18. The method as recited in claim 17, further comprising controlling the first access transistor and the second access transistor with the word line.

19. The method as recited in claim 17, further comprising activating the reverse bit line controlled feedback transistors in the first inverter and the second inverter in response to performing the write function.

20. The method as recited in claim 19, further comprising activating the reverse bit line controlled feedback NMOS transistor in the first inverter with the second bit line and activating the reverse bit line controlled feedback NMOS transistor in the second inverter with the first bit line.

* * * * *